(12) United States Patent
Brewer et al.

(10) Patent No.: US 7,253,091 B2
(45) Date of Patent: Aug. 7, 2007

(54) PROCESS FOR ASSEMBLING THREE-DIMENSIONAL SYSTEMS ON A CHIP AND STRUCTURE THUS OBTAINED

(75) Inventors: Peter D. Brewer, Westlake Village, CA (US); Michael G. Case, Thousand Oaks, CA (US); Andrew T. Hunter, Woodland Hills, CA (US); Mehran Matloubian, Encino, CA (US); John A. Roth, Ventura, CA (US); Carl W. Pobanz, Rancho Palos Verdes, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/256,336

(22) Filed: Sep. 26, 2002
(Under 37 CFR 1.47)

(65) Prior Publication Data
US 2003/0140317 A1   Jul. 24, 2003

Related U.S. Application Data

(60) Provisional application No. 60/326,076, filed on Sep. 28, 2001, provisional application No. 60/326,054, filed on Sep. 28, 2001, provisional application No. 60/326,055, filed on Sep. 28, 2001, provisional application No. 60/326,056, filed on Sep. 28, 2001.

(51) Int. Cl.
H01L 21/4763   (2006.01)
H01L 23/34    (2006.01)

(52) U.S. Cl. ............ 438/618; 438/622; 438/109; 438/928; 438/459; 257/777; 257/723; 257/686; 257/E21.705

(58) Field of Classification Search ............ 438/618, 438/109, 622, 455, 312, 316, 237, 674, 94, 438/59, 928, 758, 459, 485, 974; 257/539, 257/503, 586, 356, 93, 777, 74, 278, 723, 257/773, 782, 686, 257, E21.705, E21.512, 257/E21.238
See application file for complete search history.

(56) References Cited

U.S. PATENT DOCUMENTS 4,800,459 A  *  1/1989  Takagi et al. ............ 361/321.2

(Continued)

FOREIGN PATENT DOCUMENTS

EP          0 982 385 A1    3/2000

(Continued)

OTHER PUBLICATIONS

Chou, Stephen Y., et al, "Imprint of Sub-25 NM Vias and Trenches in Polymers," *Applied Physics Lett.*, American Institute of Physics, vol. 67, No. 21, pp. 3114-3116 (Nov. 20, 1995).

(Continued)

*Primary Examiner*—B. William Baumeister
*Assistant Examiner*—Igwe U. Anya
(74) *Attorney, Agent, or Firm*—Ladas & Parry (57) ABSTRACT

A method for assembling an electronic system with a plurality of layers. Recesses in formed in one or more dielectric layers and electronic components are positioned within the recesses. One or more layers containing the components are placed on a host substrate containing host circuits. Electrical interconnects are provided between and among the electronic components in the dielectric layers and the host circuits. The layers containing the components may also be provided by growing the electronic devices on a growth substrate. The growth substrate is then removed after the layer is attached to the host substrate.

31 Claims, 6 Drawing Sheets

U.S. PATENT DOCUMENTS

| | | | | |
|---|---|---|---|---|
| 4,912,844 | A | | 4/1990 | Parker .......................... 29/848 |
| 5,032,896 | A | * | 7/1991 | Little et al. ................. 257/686 |
| 5,065,277 | A | * | 11/1991 | Davidson .................... 361/689 |
| 5,128,831 | A | * | 7/1992 | Fox et al. .................... 361/735 |
| 5,161,093 | A | | 11/1992 | Gorczyca et al. ........... 361/414 |
| 5,284,548 | A | | 2/1994 | Carey et al. ................. 156/630 |
| 5,312,765 | A | * | 5/1994 | Kanber ......................... 438/59 |
| 5,324,687 | A | * | 6/1994 | Wojnarowski .............. 438/107 |
| 5,353,498 | A | * | 10/1994 | Fillion et al. ................. 29/840 |
| 5,426,563 | A | * | 6/1995 | Moresco et al. ............ 361/689 |
| 5,485,038 | A | | 1/1996 | Licari et al. ................. 257/758 |
| 5,489,554 | A | * | 2/1996 | Gates ........................... 438/59 |
| 5,545,291 | A | * | 8/1996 | Smith et al. ................. 438/107 |
| 5,609,907 | A | | 3/1997 | Natan ......................... 427/2.12 |
| 5,701,233 | A | * | 12/1997 | Carson et al. ............... 361/735 |
| 5,751,018 | A | | 5/1998 | Alivisatos et al. ............ 257/64 |
| 5,772,905 | A | | 6/1998 | Chou ........................... 216/44 |
| 5,783,856 | A | | 7/1998 | Smith et al. ................. 257/618 |
| 5,800,650 | A | * | 9/1998 | Anderson et al. ........... 156/150 |
| 5,824,186 | A | | 10/1998 | Smith et al. ............. 156/655.1 |
| 5,861,670 | A | * | 1/1999 | Akasaki ....................... 257/737 |
| 5,877,550 | A | | 3/1999 | Suzuki ......................... 257/700 |
| 5,904,545 | A | | 5/1999 | Smith et al. ................. 438/455 |
| 5,952,588 | A | * | 9/1999 | Young .................... 73/862.626 |
| 5,998,875 | A | * | 12/1999 | Bodo et al. .................. 257/778 |
| 6,037,255 | A | | 3/2000 | Hussein et al. ............. 438/675 |
| 6,081,988 | A | * | 7/2000 | Pluymers et al. ............. 29/601 |
| 6,096,386 | A | | 8/2000 | Biebuyck et al. ........... 427/510 |
| 6,130,823 | A | * | 10/2000 | Lauder et al. ............... 361/760 |
| 6,165,911 | A | | 12/2000 | Calveley ...................... 438/754 |
| 6,166,438 | A | * | 12/2000 | Davidson .................... 257/725 |
| 6,188,127 | B1 | * | 2/2001 | Senba et al. ................. 257/686 |
| 6,239,482 | B1 | * | 5/2001 | Fillion et al. ............... 257/678 |
| 6,294,741 | B1 | | 9/2001 | Cole, Jr. et al. ............ 174/260 |
| 6,306,680 | B1 | * | 10/2001 | Fillion et al. ............... 438/106 |
| 6,326,058 | B1 | | 12/2001 | Biebuyck et al. ........... 427/261 |
| 6,500,694 | B1 | * | 12/2002 | Enquist ....................... 438/109 |
| 6,541,346 | B2 | * | 4/2003 | Malik ........................... 438/316 |
| 6,579,463 | B1 | | 6/2003 | Winningham et al. ........ 216/41 |
| 6,586,338 | B2 | | 7/2003 | Smith et al. ................. 438/692 |
| 6,611,237 | B2 | | 8/2003 | Smith et al. ................. 343/772 |
| 6,656,568 | B1 | | 12/2003 | Winningham et al. ...... 428/145 |
| 6,946,322 | B2 | | 9/2005 | Brewer ........................ 438/109 |
| 6,984,571 | B1 | * | 1/2006 | Enquist ....................... 438/459 |
| 2002/0005294 | A1 | | 1/2002 | Mayer et al. ................ 174/260 |
| 2002/0045030 | A1 | | 4/2002 | Ozin et al. ................... 428/173 |
| 2003/0062123 | A1 | | 4/2003 | Hunter et al. ............... 156/310 |
| 2003/0068519 | A1 | | 4/2003 | Brewer et al. .............. 428/620 |
| 2003/0112576 | A1 | | 6/2003 | Brewer et al. .............. 361/119 |

FOREIGN PATENT DOCUMENTS

| | | |
|---|---|---|
| JP | 10-022338 | 1/1998 |
| WO | 01/33300 A2 | 5/2001 |

OTHER PUBLICATIONS

Chou, Stephen Y., et al, "Nanoimprint Lithography," *J. Vac. Sci. Technol. B*, American Vacuum Society, vol. 14, No. 6, pp. 4129-4133 (Nov./Dec. 1996).

"Method to Control the Geometry and Vertical Profile of Via Holes in Substrate Materials," *IBM Technical Disclosure Bulletin*, vol. 35, No. 5, pp. 211-216 (Oct. 1992).

Terfort, Andreas, et al, "Self-Assembly Of An Operating Electrical Circuit Based On Shape Complementary And The Hydrophobic Effect," *Advanced Materials*, vol. 10, No. 6, pp. 470-473, (1998).

Terfort, Andreas, et al, "Three-Dimensional Self-Assembly of Millimetre-Scale Components," *Nature*, vol. 386, pp. 162-164, (Mar. 13, 1997).

"Use of High Precision Silicon Molds for Replicating Microelectronic Packaging Structures," *IBM Technical Disclosure Bulletin*, vol. 30, No. 5, pp. 306-311 (Oct. 1987).

Borzenko, T., et al., "Polymer bonding process for nanolithography," *Applied Physics Letters*, vol. 79, No. 14, pp. 2246-2248 (Oct. 1, 2001).

Chou, S.Y., et al., "Imprint of sub-25 nm vias and trenches in polymers," *Appl. Phys. Lett.*, 67, No. 21, pp. 3114-3116 (Nov. 20, 1995).

Chou, S.Y., et al., "Nanoimprint lithography," *J. Vac. Sci. Technol. B*, vol. 14, No. 6, pp. 4129-4133 (Nov./Dec. 1996).

Tormen, M., et al., "Thermocurable polymers as resists for imprint lithography," *Electronics Letters*, vol. 36, No. 11, pp. 983-984 (May 25, 2000).

Zhang, W., et al., "Multilevel nanoimprint lithography with submicron alignment over 4 in. Si wafers," *Applied Physics Letters*, vol. 79, No. 6, pp. 845-847.

Bobbio, S.M., et al., "Integrated Force Arrays," *IEEE Proceedings of the Workshop on Micro Electro Mechanical Systems (MEMS)*, Fort Lauderdale, pp. 149-154 (Feb. 7-10, 1993).

Srinivasan, U., et al., "Fluidic Self-Assembly of Micromirrors onto Surface Micromachined Actuators," *IEEE*, pp. 59-60, (2000).

Srinivasan, U., et al., "Microstructure to Substrate Self-Assembly Using Capillary Forces," *Journal of Microelectromechanical Systems*, vol. 10, No. 1, pp. 17-24 (Mar. 2001).

Hao, E., et al., "Buildup of Polymer/Au Nanoparticle Multilayer Thin Films Based on Hydrogen Bonding," *Chem. Mater.*, vol. 12, No. 11, pp. 3392-3396 (2000).

Kumar, A., et al., "Pattering Self-Assembled Monolayers: Applications in Materials Science," *Langmuir*, vol. 10, No. 5, pp. 1498-1511 (1994).

U.S. Appl. No. 10/888,169, filed Jul. 8, 2004, Brewer.

Böhringer, K.F., et al., "Modeling of Capillary Forces and Binding Sites For Fluidic Self-Assembly," *MEMS: 2001: The 14th IEEE International Conference on Micro Electro Mechanical Systems*, pp. 369-374 (2001).

Cohn, M.B., et al., "Microassembly Tehnologies For MEMS," *SPIE Micromachining and Microfabrication, Conference on Micromachining and Microfabrication Process Technology IV*, Santa Clara, CA, 15 pages total (Sep. 21-22, 1998).

Gracias, D.H., "Forming Electrical Networks In Three Dimensions by Self-Assembly," *Science*, vol. 289, pp. 1170-1172 (Aug. 18, 2000).

Hadley, M.A., "Vertical-Cavity Surface-Emitting Laser Diodes: Design, Growth, Mode Control and Integration by Fluidic Self-Assembly," *UMI Dissertation Services*, Sections 5.4, 5.5, and 5.6, pp. 75-81 (1994).

Saitou, K., et al., "Externally Resonated Linear Microvibromotor For Microassembly," *Journal of Microelectromechanical Systems*, vol. 9, No. 3, pp. 336-346 (Sep. 2000).

* cited by examiner

PROCESS FOR ASSEMBLING THREE-DIMENSIONAL SYSTEMS ON A CHIP AND STRUCTURE THUS OBTAINED

CROSS-REFERENCE TO RELATED APPLICATIONS

The present document is related to the cop ending and commonly assigned patent application documents entitled: "Process for Assembling Three-Dimensional Systems on a Chip and Structure Thus Obtained," Ser. No. 60/326,076; "Process For Producing High Performance Interconnects," Ser. No. 60/326,054; "Method For Assembly Of Complementary-Shaped Receptacle Site And Device Microstructures," Ser. No. 60/326,055; and "Method of Self-Latching for Adhesion During Self-Assembly of Electronic or Optical Circuits," Ser. No. 60/326,056, all of which were filed on Sep. 28, 2001. The contents of these related applications are hereby incorporated by reference herein.

BACKGROUND

1. Field

The present disclosure relates to processes for fabricating electronic circuit devices, more particularly, the disclosure relates to a process for assembling three-dimensional systems on a chip and to the structure thus obtained.

2. Description of Related Art

Current methods for wafer-scale integration of different semiconductor technologies typically rely on either heteroepitaxy or wafer bonding techniques. However, both of these techniques are limited in the number of different devices and material systems that can be successfully integrated. Moreover, growth and fabrication procedures optimized for a single device technology often must be compromised to accommodate dissimilar material systems. This forces the costly development of customized processes for every component and prevents the use of low-cost foundries for producing the integrated systems.

In particular, the most basic process for wafer-scale integration is by heteroepitaxy combined with post-growth device processing. However, for the integration of a silicon substrate with group III-V semiconductor materials, components or devices, this process suffers from a large defect density caused by the mismatch in lattice parameters and by the fact that devices in the silicon substrate can only be fabricated through widely-separated "holes" in the epitaxial film. In addition, only one type of III-V layer can be utilized, which means that applications that could benefit from both Gallium Arsenide (GaAs) and Indium Phosphide (InP) devices are not possible.

Somewhat greater flexibility can be achieved through the use of wafer bonding to join silicon and III-V wafers containing already fabricated devices. However, the large thermal expansion mismatch between III-V materials and silicon requires almost complete removal of the III-V substrate prior to interconnect formation or additional processing. A further disadvantage is that wafer bonding techniques can only be used to add a single type of III-V device to silicon. A variant of this approach is to use wafer bonding and layer separation techniques to transfer a thin layer of a III-V material onto an already fabricated silicon integrated circuit wafer that has been overcoated with oxide and planarized. The transferred layer is then processed to form devices and interconnections. However, this approach also suffers from problems due to thermal expansion mismatch as well as thermal degradation of devices present in the silicon substrate during processing of the III-V layer.

For integration at the chip level, there are established methods that rely on surface-mounting techniques for attaching complete die assemblies using solder bumps or wire bonding. The most advanced of these approaches is the "flip-chip" technique that can support the integration of a wide variety of device technologies. However, flip-chip is limited to a two-dimensional planar geometry, resulting in large overall package size. Moreover, this technique is inefficient for the placement of large numbers of components, since placement is performed serially.

Technologies such as Low Temperature Co-fired Ceramics (LTCC) or High-Density Multilayer Interconnect (HDMI) are available for the formation of three-dimensional stacks of passive components. However, these technologies are not usable for three-dimensional integration of active devices. LTCC techniques require sintering at 850° C., which would destroy most processed semiconductor devices. The HDMI technique utilizes multiple levels of flexible polymer films to achieve layer-to-layer interconnects, but does not provide a method for incorporating active devices within a layer. Both LTCC and HDMI are inefficient for the placement of large numbers of components due to their serial nature.

Fluidic self-assembly is one of the latest techniques for mass assembly and integration of pre-fabricated circuits, devices and components from any materials technology onto host circuits. In particular, devices and components are delivered to the host circuits using a fluid transport process. Two different approaches are possible, which differ in the underlying mechanism used to locate, position and connect the components into the larger system. The first approach uses chemically-based driving forces to govern the assembly process like attraction, positioning, orientation, and ordering which are controlled by molecular interactions at the surfaces of the objects. The second approach uses gravitational forces and geometrical constrains like shaped components and complementarily shaped receptacle sites. Both of these approaches have been used to integrate electronic devices into hybrid electronic systems. See, for example, "Self-Assembly of an Operating Electrical Circuit Based on Shape Complementarity and the Hydrophobic Effect," *Advanced Materials*, by A. Terfort and G. M. Whitesides, 1998, 10, No. 6, pp. 470-473. A disadvantage of the gravity-based assembly methods is that they are limited to single-layer structures. In fact, since this assembly method involves the filling of receptacle sites on a host substrate by shaped device blocks, it is limited to a two-dimensional assembly. The reason for this limitation is that device blocks must have an unobstructed access to the receptacle sites.

Therefore, there is a need for a process for fabricating highly integrated systems-on-a-chip through the heterogeneous integration of group III-V compound semiconductor devices, RF materials, optical components and sensor elements with microcircuits.

SUMMARY

It is an object of the present invention to provide a process that differs substantially from conventional processes for fabricating hybrid electronic and opto-electronic assemblies and which offers radically improved functionality, simplified fabrication, and reduced cost.

Another object of the present invention is to provide a powerful system-on-a-chip technology for a wide range of applications. The process according to the present invention opens up an entirely new field of three-dimensional integrated systems-on-a-chip that offer radically improved functionality, simplified fabrication, higher yield, and superior performance than is available with any current technology.

A further object of the heterogeneous integration process according to the present invention is to permit a greater degree of design flexibility for systems on a chip.

A still further object is that of specifically incorporating a means for achieving device and layer interconnection.

Another object is that, according to the present process, virtually any device technology and/or materials family can be integrated with silicon microcircuits. This means that the components to be integrated can range from individual transistors and passive components to complete integrated circuit modules.

Yet another object of the process according to the present invention is that the functionality of individual components is not compromised by the integration process.

A further object is that the method according to the present invention has the inherent capability for forming high-performance RF inter- and intra-layer electrical connections.

Moreover, a further object is that the method is compatible with silicon processing, independently from the type of elements that are integrated with it.

According to a first embodiment, the present invention provides a process for assembling an electronic system having a plurality of layers, the process comprising the steps of: (a) forming first recesses in at least one layer of said plurality of layers; (b) forming via holes in at least one layer of said plurality of layers; (c) positioning electronic components in said first recesses; (d) metallizing said via holes; and (e) positioning layers of said plurality of layers one over the other, thereby connecting metallized via holes of one layer with electronic components of another layer. Interconnects within a layer may be created by forming a second set of recesses in a layer and then metallizing those recesses. The metallized second set of recesses can provide interconnections between layers by connecting the metallized recesses to the metallized via holes.

According to a second embodiment, the present invention provides a three-dimensional electronic structure comprising a plurality of layers positioned one over the other, at least one layer of said plurality of layers comprising first recesses and electronic components positioned in said first recesses, at least one layer of said plurality of layers comprising metallized via holes, at least one layer of said plurality of layers comprising metallized second recesses, wherein electronic components of a same layer and electronic components of different layers are connectable through said metallized via holes and said metallized second recesses. The layers are preferably dielectric layers made of thermoplastic polymer film.

According to the present invention, highly integrated systems-on-a-chip for RF, optoelectronic and sensor applications are fabricated, through the heterogeneous integration of group III-V compound semiconductor devices, RF materials, optical components and sensor elements with silicon microcircuits. The process according to the present invention allows the vertical integration of integrated circuit (IC) components and discrete devices, micro-electro mechanical devices and systems (MEMS), optical detectors, and sensor elements with silicon-based signal processing electronics to form three-dimensional stacked systems-on-a-chip.

Prior art approaches require device fabrication to take place after transfer or bonding on thin semiconductor layers, with the consequence of serious restrictions on the allowable device designs that can be employed. On the contrary, embodiments of the present invention allow for the integration of components that have been fabricated separately. This means that each individual component can have state-of-the-art performance. Therefore, the process according to the present invention allows the optimum epitaxial growth and/or device processing sequences to be employed for each component, using proven device and circuit architectures.

The present invention also provides a process by which an already-completed device layer is overlaid with a specially formulated intermediate layer into which a pattern of recessed receptacles is stamped. The receptacles serve to precisely locate the components of the next device layer. By properly choosing the dielectric properties of this intermediate layer, high-performance RF interconnections can be formed by using conventional deposition methods. In addition, novel types of connections can be realized.

The process according to the present invention can also extend the prior art fluidic self-assembly techniques to the fabrication of three-dimensional vertically integrated assemblies by using micro-stamping and layer transfer technology, thus allowing the stacking of multiple dielectric layers. The layers are imprinted with assembly templates for automatic positioning of individual components of the next device layer such as integrated circuits, discrete devices, and other passive elements. Imprinting or stamping methods are also provided for forming high performance interconnections between adjacent stacked layers and within a single layer.

According to an alternative embodiment, the present invention provides a process for fabricating one or more active device layers on a host circuit substrate, the process comprising the steps of: providing a host circuit substrate having one or more host circuits and having one or more host circuit electrical contacts electrically connected to at least one host circuit; fabricating one or more active device structures on a growth substrate to provide a first active device layer; forming one or more active device electrical contacts on the first active device layer, the one or more active device electrical contacts being electrically connected to at least one active device structure; coating the first active device layer with a dielectric layer; bonding the dielectric layer on the first active device layer to the host circuit substrate; removing the growth substrate from the active device layer; and fabricating at least one electrical connection between at least one host circuit electrical contact and at least one active device electrical contact. Additional active device layers may be disposed on top of the first active device layer by fabricating the additional active device layers on growth substrates, bonding each layer to an underlying active device layer already on the host substrate, removing the growth substrate, and fabricating electrical interconnects.

According to still another alternative embodiment, the present invention provides a three-dimensional electronic structure comprising: a host substrate having one or more host circuits; a first active device layer bonded to the host substrate, the first active device layer comprising one or more active device structures grown on a growth substrate and embedded in one or more dielectric layers, the growth substrate being removed after the first active device layer is bonded to the host substrate; and one or more interconnects electrically connecting one or more active device structures to one or more host circuits. The structure may comprise additional active device layers that are formed on growth substrates and bonded to underlying active device layers, such that the growth substrates are removed after the active device layers are bonded.

One of the most costly, time-consuming portions of satellite construction is the fabrication of the RF circuitry and support electronics. For each of the many communication channels carried on a satellite, a high-gain, low-noise receiver chain and a high-gain, high-power transmitter chain are needed. These chains contain dozens of discrete transistors, microwave-monolithic integrated circuits (MMIC), and passive microwave elements that are all painstakingly hand-assembled, which cover very large areas since they are based on 2-dimensional assembly techniques. The use of the heterogeneous integration method according to the present invention allows large gains in terms of size, weight, and performance of these RF assemblies.

BRIEF DESCRIPTION OF THE DRAWINGS

The present invention will be understood and appreciated more fully from the following detailed description taken in conjunction with the drawings described below.

DETAILED DESCRIPTION OF PREFERRED EMBODIMENTS

Reference now will be made to the drawings, which are used to aid in the description of preferred embodiments of the invention. However, the invention is not limited to the drawings or description presented herein.

According to the present invention, multiple layers consisting of vertically-integrated electronic components, such as active RF device and sensor transducers (antennas, optical receivers, etc.) are stacked one over the other.

Figure 1:
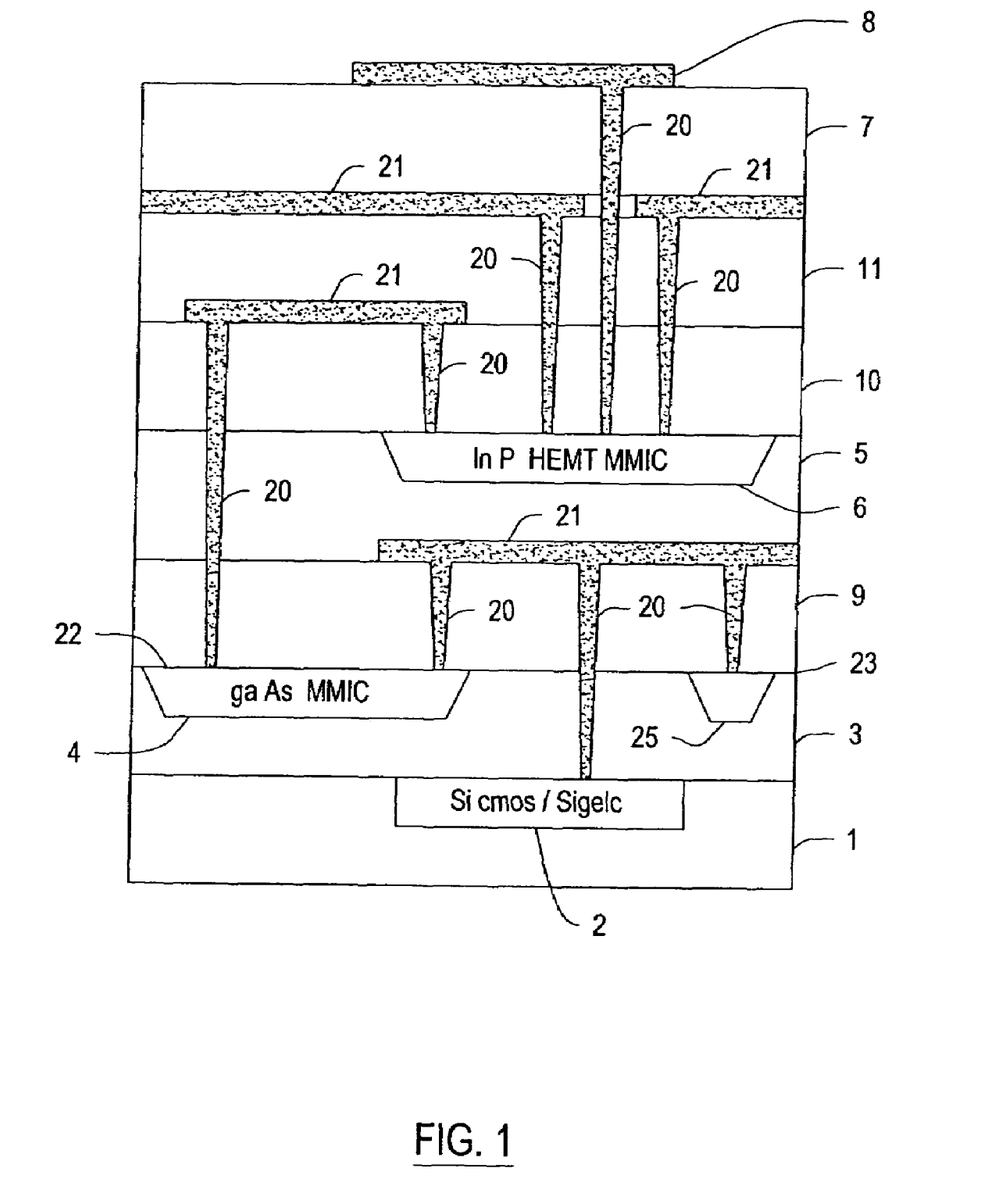
FIG. 1 shows a schematical cross-sectional view of a system architecture according to the present invention.

FIG. 1 shows a schematical cross-sectional view of an exemplary three-dimensional system architecture according to the present invention, referred to as an integrated transmit/receive module for RF applications.

A substrate 1, for example, a silicon substrate, contains a CMOS microcircuit 2, such as a high-performance Si/SiGe CMOS integrated circuit. The silicon substrate 1 forms the host circuit or base upon which multiple receptacle layers 3, 5 and 7 are registered. Each receptacle layer is capable of supporting components fabricated with different semiconductor technologies. As used herein, a "receptacle layer" is used interchangeably with "active layer" to indicate a layer that may contain active devices or components. Each component may be chosen from the most appropriate semiconductor material system to achieve optimum performance. In the embodiment of FIG. 1, receptacle layer 3 supports GaAs MMIC heterojunction bipolar transistors 4; receptacle layer 5 supports InP MMICs based on high-electron mobility transistors (HEMTs) 6; and receptacle layer 7 supports an RF antenna 8.

The structure of FIG. 1 also comprises intermediate layers 9, 10 and 11. One function of the intermediate layers 9, 10 and 11 is to provide both intra-layer and inter-layer interconnection. Interlayer connections are provided by vertical interconnects or metallized via holes 20. Intralayer connections are provided by horizontal interconnects or metallized recesses 21. The intermediate layers 9, 10 and 11 may also serve as adhesion layers between successive receptacle layers, intermediate layers, or both. In particular, the intermediate layers 9, 10 and 11 allow the metal interconnects to be raised off the surface of the IC or device. These intermediate layers 9, 10 and 11 are usually low-loss dielectric layers made, for example, of a thermoplastic polymer film.

In FIG. 1, the electronic component 6 of layer 5 is electrically connected to the electronic component 4 of layer 3 through the vertical metallized via holes 20 and the horizontal metallized recesses 21 (providing inter-layer connections). Moreover, the electronic component 4 of layer 3 is electrically connected to the electronic component 25 of the same layer through the vertical metallized via holes 20 and the horizontal metallized recesses 21 (providing intra-layer connections).

A first method for producing via holes is a plasma etching method. This method is typically limited in its ability to produce complex structures and is also restricted by practical considerations in the vertical depth of the features (a few microns). The restriction in depth is due to the low etch rates of most plasma etching schemes for etching polymers (<3000 Å/min) and the lack of robust material masking. Complex structures such as via holes with tapered sidewalls, terraced structures or asymmetrically shaped features are also difficult to produce using plasma etching.

A second method for producing via holes is an imprinting method, which involves the stamping of uniquely through-layer via holes and recesses that serve as structural preforms for metallization of complex interconnect structures. The method uses master stamps fabricated from semiconductor materials that provide a low-cost means of producing arrays of precisely shaped recesses in the polymer layers. The stamp pattern is fabricated using standard IC processes including: photolithography, wet chemical etching and/or dry etching techniques. A wide variety of sidewall shapes and angles can be obtained by employing different etching procedures and/or by selecting different crystallographic orientations and masking procedures on the stamp face. The stamping process is capable of forming micron-size structures with high aspect ratios and can produce features down to 10 nanometers.

The electrical interconnects between devices are formed by metallizing the via holes and connecting corresponding structures with metal lines. Vacuum deposition of metal films followed by electrochemical deposition is known per se and is used throughout the semiconductor industry for filling via structures. The metal layers may comprise one or more of the following metals: titanium (Ti), gold (Au), chromium (Cr), nickel (Ni), platinum (Pt) and aluminum (Al). A typical metal film consists of the following layers: Ti with a thickness of about 500 Å and Au with a thickness of about 1500 Å. However, the thickness of the individual metal layers is determined by stress/strain considerations.

Additional methods for forming electrical interconnects between devices within the same layer or on different layers are also presented and described in the cop ending and commonly assigned patent application document "Process For Producing High Performance Interconnects," Ser. No. 60/326,054.

An imprinting process may also be used to form the receptacle sites. The imprinting process for forming the sites generally involves temperature of less than 250° C. and pressure of approximately 700 psi (4,826 kPa). Micro-stamping methods as such are known in the industry and in the scientific community. A general description of micros-tamping methods can, for example, be found in U.S. Pat. No. 5,772,905 to S. Y. Chou ("Nanoimprint Lithography").

The receptacle layers (layers 3, 5 and 7 in FIG. 1) comprise dielectric materials chosen for their specific RF transmission characteristics. Such receptacle layers may be made of imprinted polymer films. An exemplary table of the various dielectric materials that may be used is presented below. The receptacle layers provide at least the following four capabilities: a) encapsulating the active integrated circuit and device components, such as circuits 4 and 6 of FIG. 1; b) providing layer planarization; c) providing inter-layer insulation; and d) supporting the metallized RF transmission lines and interconnects. These capabilities now will be analyzed in more detail.

a) Encapsulation

The molded receptacle sites complement the shape of the device or IC component, that is, the receptacle sites have shapes that match the shapes of device or IC components to be positioned within a layer. This shape matching aids in positioning and orienting the component onto the surface of the host layer.

b) Planarization

The molded receptacles may be fabricated so that the top of the assembled devices is co-planar with the top of the receptacle film. For example, see FIG. 1, in which the top surface 22 of circuit 4 is coplanar with the top surface 23 of the receptacle layer 3. Alternative embodiments are also possible, in which the imprinting process can be made to vary the height at which the device is positioned (lying above, co-planar, or recessed below the surface plane). For example, see FIG. 1, in which the RF antenna 8 is placed above the surface plane of layer 7. For most practical systems, co-planar is the preferred position.

c) Insulation

All of the polymer films are dielectrics and as such provide good electrical isolation between layers. For some high frequency RF applications, it is advantageous to have a large vertical separation between the components of one layer and those of the next. The imprinting process can be used to shape very thick films (>1 mm) while still providing very high resolution (<1 μm) patterning capability.

d) Interconnects

The polymer layer can also be imprinted with structures for fabricating the interlayer interconnects.

As pointed out above, the micro-stamping and layer transfer technology according to the present invention allows integrated circuits and discrete devices to be fully fabricated and tested before being integrated into the stack. This way, the highest possible system performance can be realized since each component is produced using the most appropriate "state-of-the-art" fabrication technology.

In the following, a sequence of four fabrication steps required for the self-assembly of a three-dimensional stacked system-on-a-chip will be briefly described.

A first step involves the patterning of a dielectric layer by forming recesses that provide specially shaped positioning receptacles for individual integrated circuits, devices, and components. The shapes of the receptacles and the device microstructures should be complementary in nature. The micro-stamping process enables fabrication of receptacles having the exact shape as the components that have to be assembled. For assembling multiple components into the same plane, each component/receptacle pair needs to be "keyed" with a geometric pattern in order to restrict assembly only to companion sites. The various keyed shapes may be squares and rectangles, circular and square, etc. These shape-pairs prevent one component from being positioned in the wrong receptacle. Another key-type of approach would be to choose two different sized components and assemble the larger one first. At the end of the first step layer alignment is performed, and the patterned dielectric film is bonded to the silicon substrate.

In a second step individual electronic components such as integrated circuit components and discrete elements are fabricated. These components/elements entail keys designed for capture and orientation by the patterned dielectric layers fabricated in the previous step. For example, with reference to FIG. 1, the shape of the MMIC circuit 4 is complementary to the shape of the corresponding recess in the receptacle layer 3.

In a third step the integrated circuits, the device elements and other components are delivered to the patterned dielectric layers, for example, by use of a fluid transport medium.

The fourth step involves the formation of interconnects for intra-layer and inter-layer RF signal transmission.

In the following, each step will be explained in more detail.

First Step

The first step involves the provision of a patterned dielectric layer to form an assembly template. The aim of this step is to enable subsequent self-location of integrated circuits and devices onto a host substrate containing one or more host circuits, for example by fluidic self-location. The patterned dielectric layer may be formed in at least one of two ways. In a first way, a dielectric film is patterned and then subsequently applied to a host substrate. In a second way, dielectric material is first applied to a host substrate as a dielectric layer, and the dielectric layer is subsequently patterned.

The patterned dielectric layer preferably comprises a thermoplastic film. The following Table 1 lists a representative set of commercially available thermoplastic films and selected properties.

TABLE 1

| Thermoplastic Dielectric Material | Glass Transition Temperature ° C. | Coefficient of Linear Expansion cm/cm/K | Dissipation factor | Dielectric Constant |
|---|---|---|---|---|
| BCB 3022 | 350° C. | 34 × 10−6 | 0.0008 | 2.7 |
| Polynorborene | 350° C. | 50 × 10−6 | 0.0001 | 2.4–2.6 |
| Polymide | 250° C. | 55 × 10−6 | 0.01 | 2.5 |
| Ethylene-chlorotrifluoro-ethylene | 190° C. | 56 × 10−6 | | 2.5 |
| Polyvinylidene Fluoride | 165° C. | | | 8–10 |
| Polyetherimide | 142° C. | 52 × 10−6 | | 3.15 |
| SU-8 | 50° C. | 52 × 10−6 | | 3–4 |

According to an embodiment of the invention, several dielectric materials with different glass transitions in forming three-dimensional stacks are employed. This means that dielectric materials with lower glass transition temperatures are preferably put at the top of the stack, in order to allow effective bonding of the top layers without affecting the underlying structures. With reference, for example, to Table 1, a four-layer structure may have polymide as a first (lowest) layer, ethylene-chlorotrifluoroethylene as a second layer, polyvinylidene fluoride as a third layer and polyetherimide as a fourth (highest) layer.

Figure 2:
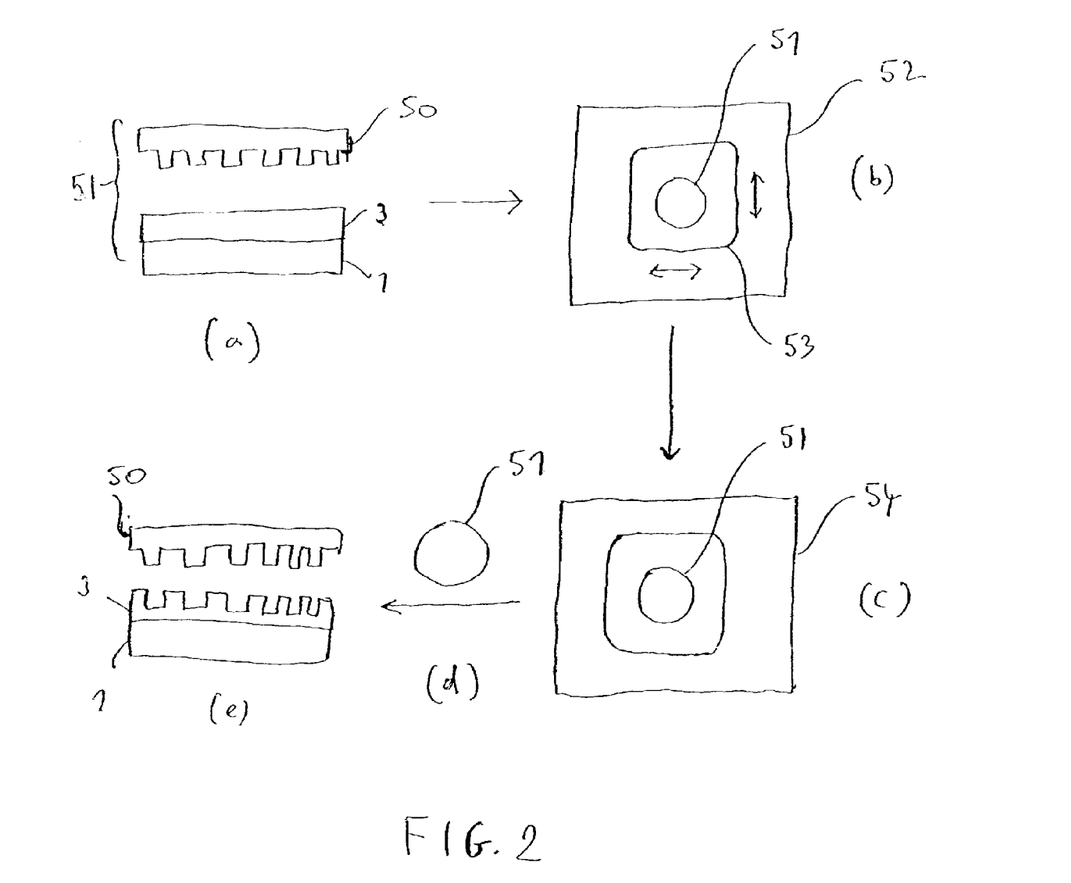
FIGS. 2(a) to 2(e) schematically illustrate the individual steps that enable formation of receptacles and via holes on a dielectric layer.

FIG. 2 schematically illustrates a preferred embodiment of the process for forming the patterned dielectric layer. More specifically, an aligned imprinting process for fabricating via holes and receptacle sites on a host circuit wafer is shown. FIG. 2(a) shows a first step of the process, where a receptacle/via stamp wafer 50 having a release agent is applied on the host circuit wafer 1 with the polymer layer 3. FIG. 2(b) shows a second step of the process, where the structure 51 (shown from a top view in FIG. 2(b)), comprising the host wafer 1 and the polymer layer 3, are aligned to the stamp 50 by means of a precision wafer aligner 52 comprising a bonding tool 53. FIG. 2(c) shows a third step of the process, where the structure 51 undergoes an embossing process in a hot embossing equipment 54. FIG. 2(d) shows a fourth step of the process, where the structure 51 is unloaded and released. Finally, FIG. 2(e) shows a fifth step of the process, where the stamp 50 is separated from the polymer layer 3 and the host wafer 1.

The polymer or dielectric layer 3 may be directly "spun-on" to the host circuit wafer 1 or substrate. Where the dielectric layer is spun-on the substrate, only an approximately 100-200 psi (689 kPa-1379 kPa) force and temperatures less than 100° C. are needed to fabricate the assembly template. The steps using a spun-on dielectric layer are discussed in more detail immediately below.

Layer Transfer

An appropriate thickness (1 μm-100 μm) of dielectric material (SU-8 photoepoxy, polymide, etc.) is spun-on to the substrate, for example, by use of a commercial photoresist spinner. The dielectric material is baked at a low temperature (around 90° C.) to produce a soft, imprintable layer.

Alignment

Shaped receptacles and interconnect vias are subsequently formed by means of a stamping device, such as a stamp pattern formed on a single crystal silicon wafer, which has to be positioned over the substrate wafer on which the dielectric film has been spun-on. Using an alignment tool with front-to-back alignment capability, the stamp wafer and the substrate wafer with the dielectric film are registered to one another. Usually, a wafer bonder/aligner equipped with double-sided alignment capability (resolution around 2 μm) is used to precisely register and attach the patterned dielectric film to the surface of the silicon substrate. For example, an EV Group Inc. (Phoenix, Ariz.) Model 501 bonder/aligner can be used. The stamp and substrate wafers are fixed in position one to another using a bonding tool. The bonding tool and the wafers are then transferred into a hot embossing machine to produce imprinted structures.

Bonding

By pressing the stamp wafer into the dielectric film on the host substrate, the shaped receptacles and interconnect vias pre-forms are formed. An embossing machine (for example, the EV Group 501 Wafer Bonder or EV Group 520HE Hot Embossing/Wafer Bonding System) performs the molding process under high vacuum conditions and precise temperature and stamping pressure control. The soft dielectric materials can be imprinted at low pressures, typically less than 6.9 atmospheres (100 psi) and less than 100° C. Low pressure and temperature help avoid damages to the underlying wafer circuitry that may be caused by higher pressures and/or higher temperatures. After the imprinting process, the stamp wafer and the patterned host substrate wafer are separated. At this point the dielectric film is baked at a temperature of around 120° C. to harden the material or alternatively it is exposed to UV light if photo-curing is required. Electric interconnects can now be formed to the underlying circuits and the receptacle layer can be populated with devices and ICs.

Stacking Dielectric Layers

As soon as the fabrication of the first layer is completed, a second layer may be applied in a similar fashion as the first. The first step for building the second layer is to spin-on (using a commercial photoresist spinner) an appropriate thickness (1 μm-100 μm) of dielectric material (SU-8 photoepoxy, polymide, etc.) on top of the first layer. The layers are baked at a low temperature (~90° C.) so that the second layer comprises a soft, moldable film. Next, the host wafer having the first layer with its assembled devices and interconnects and the moldable second layer is aligned to a second stamp. The aligned stamp and host wafer are transferred into the hot embossing machine where the second layer of dielectric film is imprinted with the stamp. The second layer is then cured (heating or UV-curing), followed by population with active components (for example by fluidic self-assembly) and the formation of electrical interconnects. This process flow is repeated until the electronic assembly is completed.

One disadvantage of the process of stamping the dielectric layer already applied to a host circuit wafer (or another dielectric layer) for forming the recessed receptacle sites is its potential of damaging the underlying electronic devices and interconnect structures in the underlying layer. As noted briefly above, an alternative approach is to separately stamp a dielectric film and then apply the stamped film to the circuit carrying layers.

Figures 7A, 7B, 7C:
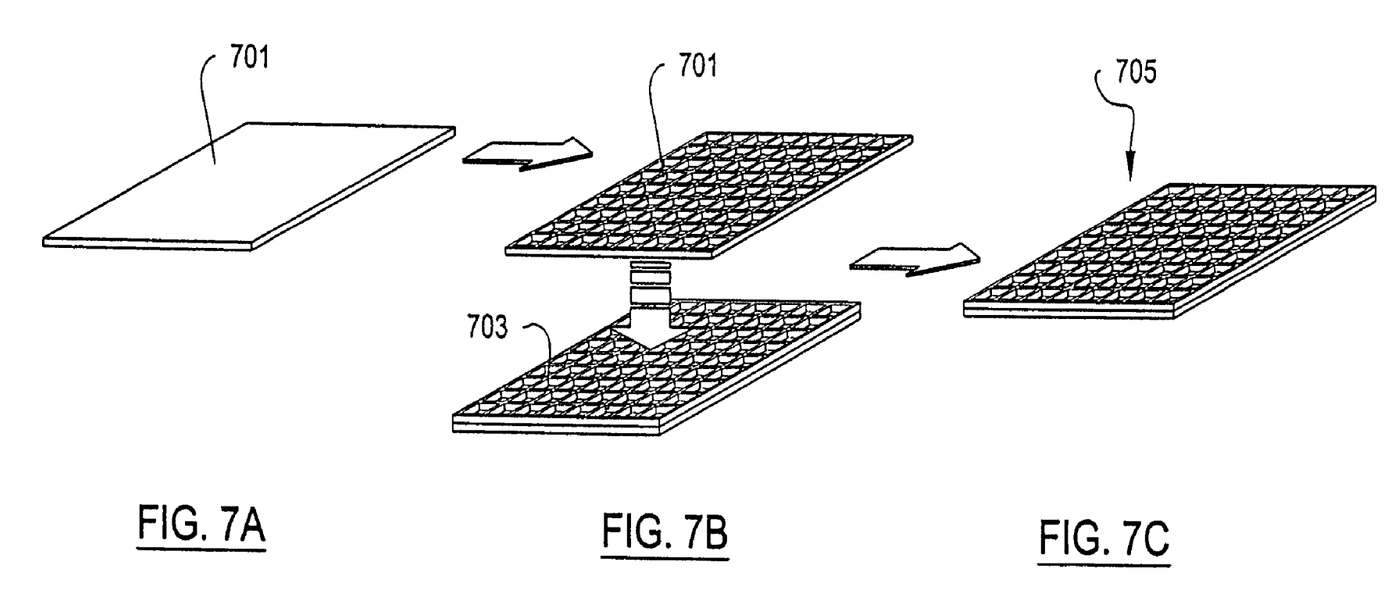
FIGS. 7A to 7C show the steps for registering a stamped dielectric layer to an underlying host substrate according to one embodiment of the present invention.

FIGS. 7A to 7C depict a process for forming an assembly template and then applying the assembly template to a host substrate. FIG. 7A depicts the provision of a sheet of a dielectric film 701. The dielectric film 701 may comprise any of the dielectric materials discussed below. FIG. 7B shows the dielectric film 701 after it has been patterned and is in preparation for application to a host substrate 703. The dielectric film 701 is preferably patterned by micro-stamping as discussed above. However, unlike the process discussed above, the dielectric film 701 may be simply placed on an underlying carrying structure (such as a silicon wafer) to facilitate the stamping of the film 701, but the film should not adhere to the carrying structure.

After the dielectric film 701 is patterned, the film 701 is aligned and registered to a host substrate 703 as shown in FIG. 7B. The dielectric film 701 may be aligned to the host substrate 703 using the alignment process and alignment hardware discussed above. The application of heat and bonding pressure may be used to bond the dielectric film 701 to the substrate 703 to provide the assembly template 705 depicted in FIG. 7C. Alternative methods may use an adhesive to ensure that the dielectric film stays properly in place on the substrate 703. Multiple layer structures may be provided by simply applying another stamped dielectric film on top of an underlying layer that has already been populated with circuits and provided with metallized interconnects, as discussed in more detail below.

Second Step

The second step of the fabrication sequence involves fabrication of the integrated circuits and discrete RF devices, selective etching, and liberation of individual elements. Of course, this second step could also be performed before the above described first step, being independent therefrom.

Figure 3:
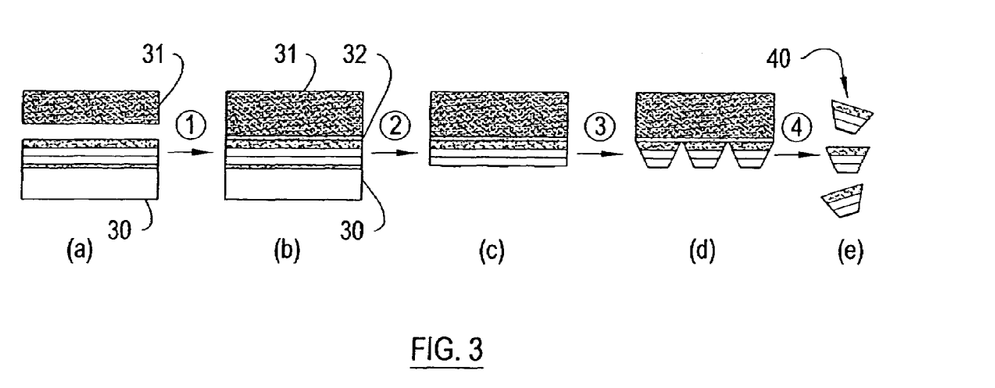
FIGS. 3(a) to 3(e) show different substeps for fabrication, etching and liberation of individual elements.

FIG. 3 shows schematically four different stages of this second step:

(1) During a first stage (depicted in FIGS. 3a and 3b), a wafer active device structure 30 is attached to a carrier 31. A photoresist layer 32 protects the active structure 30;
(2) During a second stage (depicted in FIG. 3c), the wafer is thinned;
(3) During a third stage (depicted in FIG. 3d), the component perimeters are lithographically defined. In the preferred embodiment, transmission lithograph is used for front-to-backside alignment of the etch release photoresist pattern. Still in the preferred embodiment, wet-chemical etching is used for tapering of the sidewall (typically with a 45° sidewall angle) and for through-wafer etching; and
(4) During a fourth stage (FIG. 3e), the components are separated into individual components 40, such as MMICs, discrete devices, etc.

The fabrication of the tailored sidewall profiles enables the production of the pedestal or "micro-key" shape used to locate the individual integrated circuits and devices into the micro-stamped receptacle sites in the dielectric layers. A person skilled in the art will, however, recognize a number of alternative sidewall shaping schemes that utilize crystallographically selective wet-chemical etching.

Third Step

After components 40 (e.g. individual MMICs and discrete devices) containing selectively etched "keys" have been created (second step) and corresponding sites in the bonded dielectric layers have been prepared (first step), the freed individual components 40 will be delivered to the sites, for example, by means of a fluid transport process.

Figure 4:
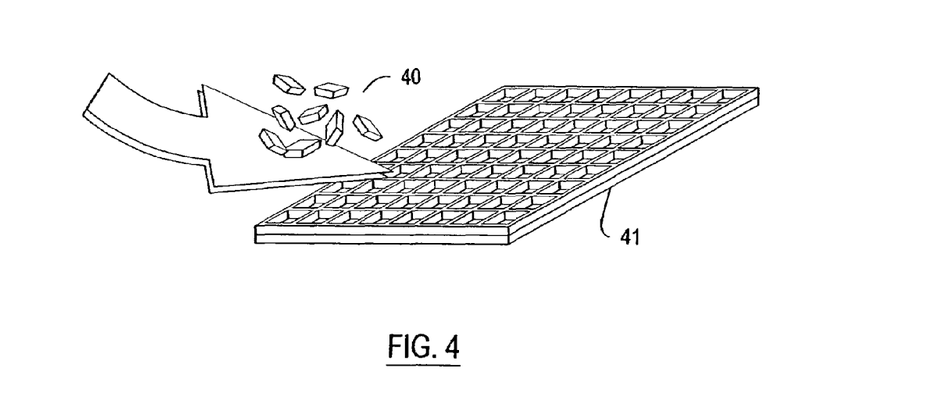
FIG. 4 shows the assembly step of the individual elements using fluid transport.

FIG. 4 illustrates the ease of assembly using fluid transport. In the preferred embodiment, an ethanol slurry is used to "flow" the individual components 40 over a prepared layer 41. In the preferred embodiment, a multi-step assembly sequence is envisioned, in which the larger components, such as integrated circuits, are incorporated before the smaller components, such as discrete devices. After the individual integrated circuits and devices access their companion locations, the transport liquid is removed, the components 40 are encapsulated and the layer 41 is prepared for interconnect metallization.

Water, ethanol, methanol, ethylene glycol can be alternatively used as a fluid medium. Surfactants can also be added, to prevent devices from sticking to the areas where they do not belong.

Alternative methods of fluidic assembly are presented and described in cop ending and commonly assigned patent applications: "Method For Assembly Of Complementary-Shaped Receptacle Site And Device Microstructures," Ser. No. 60/326,055; and "Method of Self-Latching for Adhesion During Self-Assembly of Electronic or Optical Circuits," Ser. No. 60/326,056. The methods described in these applications may also be used in accordance with the present invention.

Figure 5:
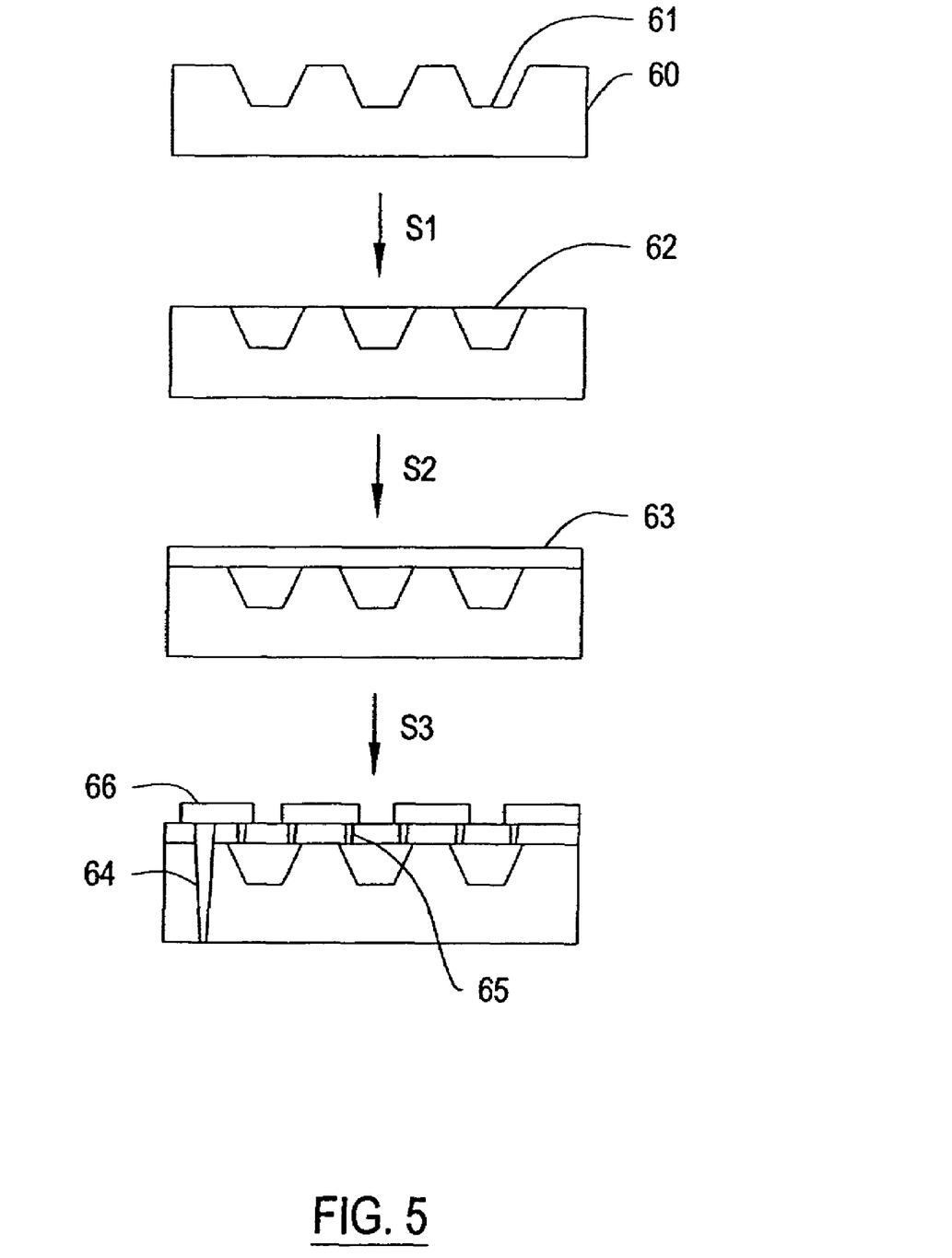
FIG. 5 shows the steps of an encapsulation process according to the present invention.

The encapsulation process is shown schematically in FIG. 5. In this process, the located device components 62 (positioned into receptacles 61 of the substrate 60 in step S1) are covered with a dielectric layer 63 (step S2) that is used to hold the device in place and as a structural and insulating layer for connecting and running metal interconnect lines 64-66 over the surface of the device (step S3). The dielectric layer 63 can be applied by spinning-on a liquid dielectric material and then curing the film or by vacuum depositing a dielectric film. The dielectric materials can be chosen from the materials shown in Table 1.

Fourth Step

In this last step, robust interconnections are formed for signal transmission along the same layer (intra-layer transmission) and between different layers (inter-layer transmission), as already explained with reference to FIG. 1.

Low-loss, controlled impedance transmission lines and interconnections for both intra- and inter-layer RF signal propagation are critical to highly integrated three-dimensional assemblies. Governing the wave-guiding properties of the integration dielectrics are the thickness, permittivity ($\in_R$) and loss tangent (tan $\partial$) of the material at a given frequency.

In order to show the importance of material selection, Table 2 -(as shown below) presents transmission line loss on a 25-µm-thick dielectric layer at different frequencies for different tan $\partial$ values. The first row with a value of zero for the loss tangent depicts the case of a perfect dielectric material and the transmission line losses are the result of the metal resistance. Dielectric losses are most significant at higher frequencies. Table 2 uses a comparison of 50Ω microstrip transmission line loss using 1 µm thick gold metallization on a 25 µm thick dielectric at different frequencies for different tan $\partial$ values. Most crystalline and ceramic substrates have tan $\partial$<0.001, while polymides typically range from 0.01 to 0.02. Clearly, the material requirements are application specific.

TABLE 2

| tan$\partial$ | 10 GHz | 60 GHz | 94 GHz |
|---|---|---|---|
| 0.00 | 0.47 dB/cm | 1.3 dB/cm | 1.6 dB/cm |
| 0.01 | 0.60 dB/cm | 2.1 dB/cm | 2.9 dB/cm |
| 0.02 | 0.73 dB/cm | 2.9 dB/cm | 4.1 dB/cm |

The simplest method of implementing the vertical interconnects required for three-dimensional assemblies is to vacuum deposit metal to form a connection from a lower plane through a stamped hole in the stacking material to the upper plane, see also the vertical vias 2 of FIG. 1. In this way, standard fabrication processes can be used for metal patterning. Micro-stamping methods are applied to form conically-shaped via holes for metallization of the interlayer interconnections. In the preferred embodiment, the via holes will be formed along with the imprinting of the chip and device receptacles prior to transferring the patterned dielectric layer onto the silicon substrate. Any residual material at the bottom of the via holes will be removed by plasma etching.

Alternative Method for Fabricating Active Device Layers

An alternative method for fabricated the aligned stacks of active device layers is schematically shown in FIGS. 6A-6G. Rather than separating components formed on a single wafer into individual parts and then using fluidic self-assembly techniques to place the components within a layer as described above, this alternative method provides that the fabricated device and IC components are transferred directly from their growth substrate to a 3-D assembly using a dielectric layer as the transfer medium. The transfer medium comprises preferably a thin dielectric material with embedded electronic devices and circuit components, and intralayer interconnecting lines.

FIGS. 6A-6G depict the formation, alignment, and integration of the active layers according to this alternative method onto a host silicon wafer with a sequence of seven fabrication steps. Additional alternative methods may use more or less than seven steps depending on the type of device and IC components fabricated on the growth substrate.

In the sequence of steps shown in FIGS. 6A-6G, the devices, once transferred, are "upside down" compared to their normal orientation on the growth wafer. To provide for access to the device contacts after the devices are turned upside down, it is preferable that the contacts from the normal topside of the devices are routed to the bottom side of the dielectric medium so that the contacts are accessible after the devices are transferred. Alternatively, the devices can be grown in an inverted sequence to allow topside contact formation to the device after transfer.

FIGS. 6A-6G depict the formation of two terminal devices, such as a resonant tunneling diode (RTD), through the use of normally grown device structures. Similar although possibly more elaborate processes may be used to integrate multiple terminal devices, such as three terminal devices including field effect transistors (FETs), high electron mobility transistors (HEMTs), heterojunction bipolar transistors (HBTs), and other similar devices.

Figure 6A:
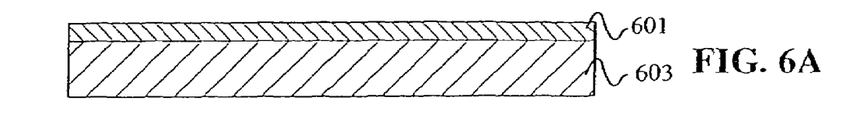
FIGS. 6A to 6G show the steps of an alternative method for fabricating an active device layer according to the present invention.

FIG. 6A depicts the growth of the device structures to be used to provide the desired device and circuit components, such as RTDs, FETs, HEMTs, HBTs, etc., with active layers fabricated in their normal sequence on a growth substrate 603. The single epilayer 601 shown in FIG. 6A represents the multiple layers of epitaxial films that may be required for a device. The active layers are grown on appropriate substrates by molecular beam epitaxy (MBE) or metal-organic chemical vapor deposition (MOCVD). Substrate wafer materials are preferably chosen to closely match the lattice parameters of the epitaxially grown active layers. The materials for the growth substrate 603 for most applications may include GaAs, InP, SiC, $Al_2O_3$, Si, SiGe, InSb, and InAs. The multiple epitaxial films comprising the single epilayer 601 are typically thin, preferably ranging from 1 micron to 10 microns thick, and are comprised of electrically active layers fabricated specifically for a particular device.

Figure 6B:
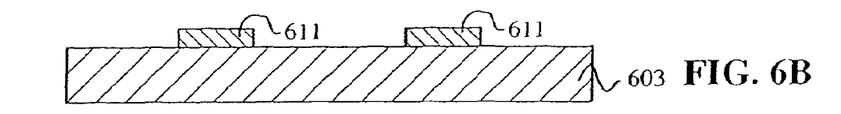
Figure 6C:
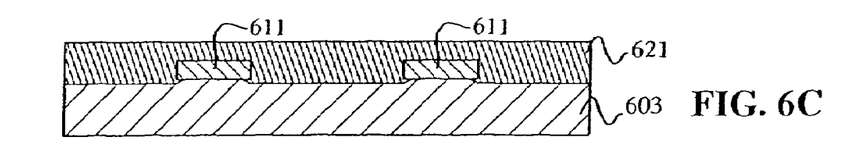

FIG. 6B depicts the delineation of the epilayer 601 into arrays of device structures 611. Dry or wet etching and photolithographic techniques may be used to create the arrays of device structures 611. Preferably, the device structures 611 are undercut with respect to the growth substrate 603 so that the coating layer 621, applied as shown in FIG. 6C, covers the edges of the device structures 611. Alignment marks may also be fabricated on the backside of the growth substrate 603, which enable alignment of the front side device structures 603 during transfer to a host circuit wafer. The front-to-back alignment may be performed in a commercially available alignment machine, such as an EV620 aligner from EV Group, Inc. of Phoenix, Ariz.

FIG. 6C shows the step of coating the arrays of device structures 611 attached to the growth substrate 603 with a spin-on dielectric layer 621. Preferably, the dielectric layer 621 comprises SU-8, polymide, BCB, or other materials listed in Table 1. As previously noted, it is preferable that the layer 621 covers the edges of the device structures 611. Such coverage helps ensure that the device structures 611, once released from the growth substrate 603, are securely embedded in the dielectric layer 621. Preferably, the dielectric layer 621 has a thickness in the range of 2-11 microns, depending on the thickness of the device structures 611. Once the dielectric layer 621 is applied, it may be cured by baking at temperatures preferably in the range of 100°-150° C. and/or UV exposure, as previously described.

Figure 6D:
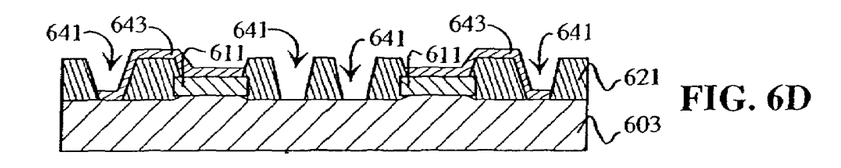

FIG. 6D shows the step of fabricating via holes 641 for electrical contact 643 formation and fabricating the electrical contacts 643. The electrical contacts 643 are formed to contact the topsides of the device structures 611 and to route electrical connections to the underside of the dielectric layer 621. The electrical contacts 643 are preferably fabricated with deposited metal that allows a direct electrical connection from the exposed side of the device structures 611 to the bottom side of the dielectric layer 621.

Figure 6E:
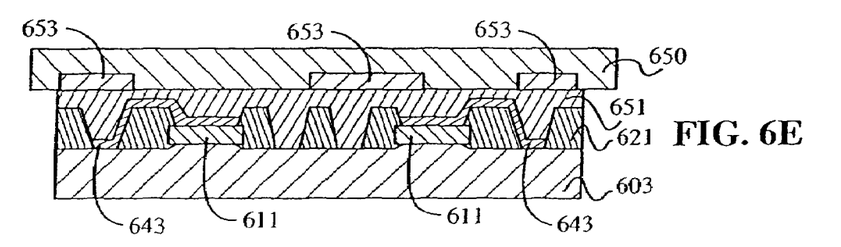

FIG. 6E shows the step of coating the partially connected device structures 611 with a second spin-on dielectric layer 651, aligning and bonding the second dielectric layer 651 with the device structures 611 to a host circuit wafer 650 with host circuits 653. Preferably, the material of the second dielectric layer 651 comprises the materials listed in Table 1, such as SU-8, polymide, BCB, or spun-on glasses. The thickness of the second dielectric layer 651 is preferably in the range of 1-2 microns. The second dielectric layer 651 is used for planarization, adhesion, and for electrically insulating the device structures 611 from host circuits 653 on the host circuit wafer 650. After the spin-on application of the second dielectric layer 651, the layer 651 may be cured by baking at temperatures in the range of 100° C.-150° C. and/or UV exposure.

The growth substrate 603 with the delineated device structures 611 is aligned to the host circuit wafer 650 by registering backside alignment keys on the growth substrate 603 with front side alignment keys on the host circuit wafer 650. The alignment may be performed in a commercially available wafer alignment tool such as the EV 620 aligner from EV Group, Inc. Preferably, the tool has an accuracy tolerance of 0.5 to 1.0 micron or better for wafer-to-wafer alignment. The wafers are typically fixed in position to one another using a bonding fixture, such as those used with the EV Group, Inc. wafer bonding and wafer alignment machines. After the growth substrate 603 is aligned with the host circuit wafer 650, the aligned pair is preferably transferred into a hot embossing machine, such as the EV 520HE from EV Group, Inc., to bond the second dielectric layer 651 to the host circuit wafer 650. Bonding of the growth substrate 603 to the host circuit wafer 650 is preferably performed in a vacuum environment where the aligned pair are heated above the glass transition temperature of the second dielectric layer 651 to achieve adequate bonding.

Figure 6F:
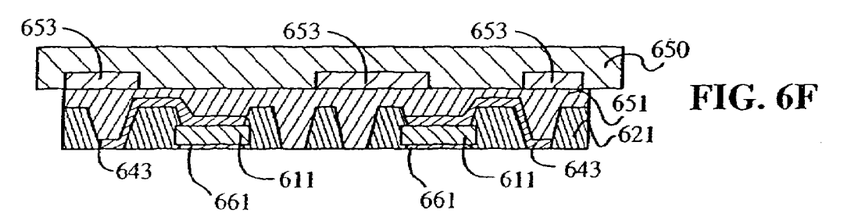

FIG. 6F depicts the removal of the growth substrate 603 and the formation of "topside" electrical contacts 661. Removal of the growth substrate 603 may be accomplished in any one of several ways. Preferably, lapping or grinding the growth substrate 603 is performed to remove the bulk of the substrate, typically in a range from about 100 microns to about 500 microns. Then, chemical-mechanical-polishing may be performed to remove an additional portion of the growth substrate, typically in a range from about 30 microns to about 100 microns. Finally, selective etching to the epilayer surface may be performed. Preferably, an etch stop layer is fabricated under the device structures 611 to enhance etch selectivity for removing the growth substrate 603 from the device structures 611. An alternative approach for removing the growth substrate is to use a "smart cut," which is known in the art, that cleaves the top approximately 5 microns of the epilayer 601 and growth substrate 603 from the remainder of the growth substrate 603 by activating a buried hydrogen implanted layer. The activation, typically a heating process at around 150° C., forms a layer of hydrogen bubbles that cause the surface layer to cleave off of the growth substrate 603. The remaining material of the growth substrate 603 after the "smart cut" may then be removed by using selective wet or dry etching procedures.

Figure 6G:
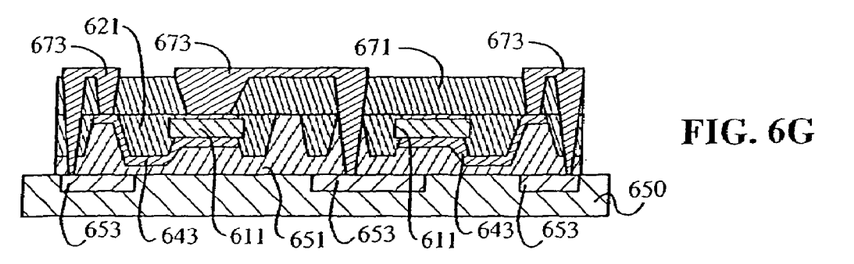

FIG. 6G depicts the final step for fabricating the aligned stacks of device layers. As shown in FIG. 6G, the device structures 611 are interconnected with the host circuits 653 in the host circuit wafer 650. This step may be performed by the procedures described above. One method for providing the interconnections is to first spin-on a dielectric film 671; then photolithographically define via holes; then plasma etch the via holes for accessing the topside of the device structures 611 and host circuit 653 interconnect pads; and then fabricate the interconnect lines 673 from the contact positions on the device structures 611 to the interconnect pads on the host circuits 653. Additional layers of spin-on dielectric coating may then be applied to support additional device or interconnect layers.

Additional active device layers may be added on top of the active device layer bonded to the host circuit wafer 650 by repeating the steps depicted in FIGS. 6A-6G. However, instead of bonding the additional active device layer to the host circuit wafer 650, each additional active device layer is bonded to the top active device layer already contained within the aligned stack of active device layers. Also, additional intermediate layers may be used to support additional electrical interconnects using the methods previously described.

The invention has been described with reference to particular embodiments. Modifications and alterations will occur to others upon reading and understanding this specification. It is intended that all such modifications and alterations are included insofar as they come within the scope of the appended claims or equivalents thereof.

What is claimed is:

1. A process for assembling an electronic system having a plurality of layers, the process comprising:
   forming first recesses in at least one layer of said plurality of layers;
   forming via holes in at least one layer of said plurality of layers;
   positioning active electronic circuits in said first recesses;
   metallizing said via holes; and
   positioning layers of said plurality of layers one over the other, thereby connecting metallized via holes of one layer with active electronic circuits of another layer.

2. The process of claim 1, further comprising:
   forming second recesses in at least one layer of said plurality of layers;
   metallizing said second recesses; and
   connecting metallized via holes with said metallized recesses.

3. The process of claim 1 wherein said layers are dielectric layers.

4. The process of claim 3 where said layers are made of a thermoplastic polymer film.

5. The process of claim 1, wherein said positioning of active electronic circuits is performed through use of a fluid transport medium.

6. The process of claim 5, wherein said fluid transport medium is an ethanol slurry.

7. The process of claim 5, wherein said active electronic circuits have different sizes and the active electronic circuits are positioned in order of the sizes of the active electronic circuits with the larger sized active electronic circuits being positioned first.

8. The process of claim 1, wherein said active electronic circuits and said first recesses are shaped to be complementary to each other.

9. The process of claim 1, wherein said first recesses and via holes are formed through a microstamping method.

10. The process of claim 1, wherein said forming first recesses and said forming via holes are performed through an imprinting process.

11. The process of claim 10, wherein said layers are thermoplastic films and wherein thermoplastic films with lower glass transition temperatures are placed over films with higher glass transition temperatures.

12. The process of claim 1, wherein said at least one layer is applied by a spin-on process.

13. The process of claim 1, wherein said first recesses and via holes are formed by means of a stamping device.

14. The process of claim 1, wherein said active electronic circuits comprise three terminal devices.

15. The process of claim 1, wherein said active electronic circuits rest along a surface of the layer in which said first recesses were formed.

16. A three-dimensional electronic structure comprising a plurality of layers positioned one over the other, at least one layer of said plurality of layers comprising first recesses and active electronic circuits positioned in said first recesses, at least one layer of said plurality of layers comprising metallized via holes, at least one layer of said plurality of layers comprising metallized second recesses, wherein active electronic circuits of a same layer and active electronic circuits of different layers are connectable through said metallized via holes and said metallized second recesses.

17. The three-dimensional electronic structure of claim 16, wherein said layers are dielectric layers.

18. The three-dimensional electronic structure of claim 17, wherein said layers are made of a thermoplastic polymer film.

19. The three-dimensional electronic structure of claim 16, wherein said active electronic circuits and said first recesses are shaped to be complementary to each other.

20. The three-dimensional electronic structure of claim 16, wherein said layers are thermoplastic films and wherein thermoplastic films with lower glass transition temperatures are placed over films with higher glass transition temperatures.

21. The three-dimensional electronic structure of claim 16, wherein said active electronic circuits rest along a surface of the at least one layer comprising said first recesses.

22. A process for fabricating one or more active device layers on a host circuit substrate, the process comprising:
   providing a host circuit substrate having one or more host circuits and having one or more host circuit electrical contacts electrically connected to at least one host circuit;
   fabricating one or more active device structures having two opposing surfaces on a growth substrate to provide a first active device layer;
   forming a plurality of active device electrical contacts on the first active device layer, at least one active device electrical contact being electrically connected to one surface of at least one active device structure, another active device electrical contact being electrically connected to another surface of the at least one active device structure;

coating the first active device layer with a dielectric layer;

bonding the dielectric layer on the first active device layer to the host circuit substrate;

removing the growth substrate from the active device layer; and fabricating at least one electrical connection between at least one host circuit electrical contact and at least one active device electrical contact.

23. The process according to claim 22, further comprising:

fabricating one or more active device structures on a second growth substrate to provide a second active device layer;

forming one or more active device electrical contacts on the second active device layer, the one or more active device electrical contact being electrically connected to at least one active device structure on the second growth substrate;

coating the second active device layer with a dielectric layer;

bonding the dielectric layer of the second active device layer to the first active device layer;

removing the second growth substrate from the second active device layer; and fabricating at least one electrical connection between at least one active device electrical contact of the second active layer and at least one active device electrical contact of the first active device layer or at least one host circuit electrical contact.

24. The process according to claim 22, wherein forming one or more active device electrical contacts comprises:

coating the active device structures with a device structure dielectric layer with a top side and a bottom side;

fabricating one or more via holes in the device structure dielectric layer; and metallizing one or more via holes to provide the one or more active device electrical contacts.

25. The process according to claim 22, wherein fabricating one or more active device structures additionally comprises: delineating the active device structures with wet or dry etching and fabricating alignment marks on a back side of the growth substrate.

26. A three-dimensional electronic structure comprising:

a host substrate having one or more host circuits;

a first active device layer bonded to the host substrate, the first active device layer comprising one or more active device structures having two opposing surfaces grown on a growth substrate and embedded in one or more dielectric layers, the growth substrate being removed after the first active device layer is bonded to the host substrate; and one or more interconnects electrically connecting two opposing surfaces of one or more active device structures to one or more host circuits.

27. The three-dimensional electronic structure of claim 26 further comprising:

one or more additional active device layers disposed above the first active device layer in a stacked arrangement, each one of the one or more additional active device layers being bonded to a lower active device layer in the stacked arrangement, each one of the one or more additional active device layers comprising one or more active device structures grown on an additional growth substrate and embedded in one or more dielectric layers, the additional growth substrate being removed after each one of the one or more additional active device layers is bonded to the lower active device layer; and one or more interconnects electrically connecting one or more active device structures of the one or more additional active device layers to one or more active device structures of one or more lower active device layers or to one or more host circuits.

28. The three-dimensional electronic structure of claim 26 wherein said active device structures are grown by molecular beam epitaxy or metal-organic vapor deposition.

29. The three-dimensional electronic structure of claim 26 wherein said growth substrate comprises GaAs, InP, SiC, $Al_2O_3$, Si, SiGe, InSb, or InAs.

30. The three-dimensional structure of claim 26 wherein said active device structures comprise resonant tunneling diodes, field effect transistors, high electron mobility transistors, or heterojunction bipolar transistors.

31. A process for fabricating one or more active device layers on a host circuit substrate, the process comprising:

providing a host circuit substrate having one or more host circuits and having one or more host circuit electrical contacts electrically connected to at least one host circuit;

fabricating one or more active device structures on a growth substrate to provide a first active device layer;

coating the active device structures with a device structure dielectric layer with a top side and a bottom side;

fabricating one or more via holes in the device structure dielectric layer; and metallizing one or more via holes to provide the one or more active device electrical contacts, the one or more active device electrical contacts being electrically connected to at least one active device structure;

coating the first active device layer with a dielectric layer;

bonding the dielectric layer on the first active device layer to the host circuit substrate;

removing the growth substrate from the active device layer; and fabricating at least one electrical connection between at least one host circuit electrical contact and at least one active device electrical contact.

* * * * *